United States Patent
Choi et al.

(10) Patent No.: US 7,405,362 B2
(45) Date of Patent: Jul. 29, 2008

(54) SEMICONDUCTOR DEVICES HAVING MORE THAN TWO-ROWS OF PAD STRUCTURES AND METHODS OF FABRICATING THE SAME

(75) Inventors: Jung-hwan Choi, Gyeonggi-do (KR); Dae-Woon Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 350 days.

(21) Appl. No.: 11/041,660

(22) Filed: Jan. 24, 2005

(65) Prior Publication Data
US 2005/0139388 A1    Jun. 30, 2005

(30) Foreign Application Priority Data
Feb. 10, 2004    (KR)    .................. 10-2004-0008643

(51) Int. Cl.
*H05K 1/00*    (2006.01)
*H05K 3/02*    (2006.01)
*H05K 3/10*    (2006.01)

(52) U.S. Cl. .................... 174/250; 257/773; 29/846

(58) Field of Classification Search ......... 257/773–776; 174/250
See application file for complete search history.

(56) References Cited

U.S. PATENT DOCUMENTS

| | | | | |
|---|---|---|---|---|
| 5,686,764 A | * | 11/1997 | Fulcher | .................. 257/778 |
| 6,301,143 B1 | | 10/2001 | Fujita et al. | |
| 6,560,134 B2 | | 5/2003 | Brox et al. | |
| 6,570,812 B2 | | 5/2003 | Kono | |
| 6,762,489 B2 | * | 7/2004 | Daves et al. | ............. 257/692 |

FOREIGN PATENT DOCUMENTS

| | | |
|---|---|---|
| JP | 2000216253 | 8/2000 |
| JP | 2001060625 | 3/2001 |

* cited by examiner

*Primary Examiner*—Jeremy C Norris
(74) *Attorney, Agent, or Firm*—Myers Bigel Sibley & Sajovec PA (57) ABSTRACT

A semiconductor device is provided including a printed circuit board and first, second and third rows of power and/or signal pads on the printed circuit board. A plurality of input and output buffers are also provided. Ones of the plurality of input and output buffers are provided between the first and second rows and others of the plurality of input and output buffers are provided between the second and third rows. Related methods of fabricating semiconductor devices are also provided.

16 Claims, 7 Drawing Sheets

FIG. 7

SEMICONDUCTOR DEVICES HAVING MORE THAN TWO-ROWS OF PAD STRUCTURES AND METHODS OF FABRICATING THE SAME

CLAIM OF PRIORITY

This application is related to and claims priority from Korean Patent Application No. 2004-08643, filed on Feb. 10, 2004, the disclosure of which is hereby incorporated herein by reference as if set forth in its entirety.

FIELD OF THE INVENTION

The present invention relates to semiconductor devices and methods of fabricating the same and, more particularly, to semiconductor devices having pad structures and methods of fabricating the same.

BACKGROUND OF THE INVENTION

Figure 1:
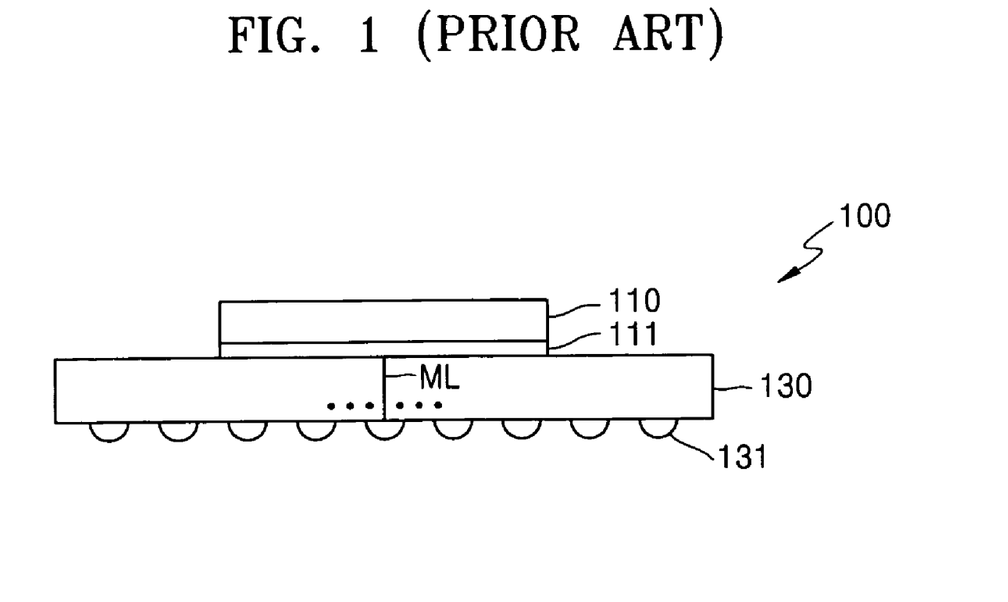
FIG. 1 is a cross section illustrating a conventional semiconductor element including a semiconductor device including a pad structure.

FIG. 1 is a cross section of a semiconductor element including a semiconductor device having a conventional row pad structure. As illustrated in FIG. 1, the semiconductor element 100 includes the semiconductor device 110 and a printed circuit board (PCB) 130, for example, having a ball grid array (BGA) package type.

The semiconductor device 110 may be a bare semiconductor chip, for example, a dynamic random access memory (DRAM), and includes a pad layer 111 on a surface adjacent the PCB 130. A row pad, which is included in the pad layer 111, is electrically coupled to a plurality of solder balls 131 on a surface of the PCB 130 opposite the pad layer 111 via a corresponding metal line ML. The solder balls 131 may also be electrically coupled to an external device (not shown).

Figure 2:
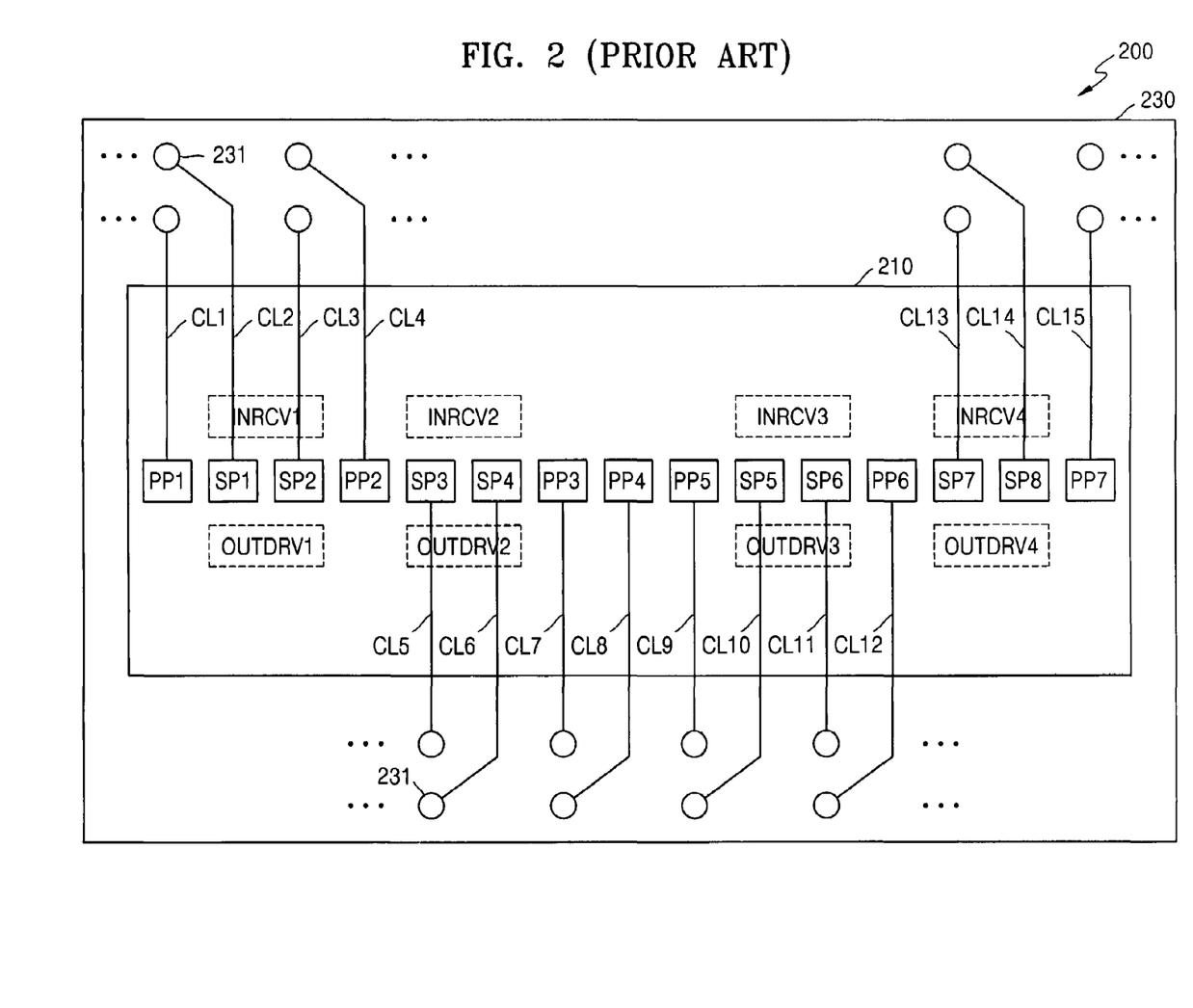
FIG. 2 is a plan view of a conventional semiconductor element including a semiconductor device having a single row pad structure.

Referring now to FIG. 2, a plan view of a semiconductor element including a semiconductor device having a single row pad structure will be discussed. As illustrated in FIG. 2, a conventional semiconductor element 200 may include a semiconductor device 210 and a PCB 230. A plurality of pads composing a single row pad structure in the pad layer of the semiconductor device 210 are provided in the center of the semiconductor device 210. Such a pad arrangement may be referred to as a center pad arrangement. The pads include first through eighth signal pads SP1 through SP8 and first through seventh power pads PP1 through PP7. Control signals, such as input/output data signals and command signals, may be transmitted via the first through eighth signal pads SP1 through SP8. A power supply voltage, a ground voltage, or a termination voltage is applied to the first through seventh power pads PP1 through PP7.

For example, the first and second signal pads SP1 and SP2 provided between a first input buffer INRCV1 and a first output buffer OUTDRV1 may be data input/output (DQ) pads. A DQ input/output (IO) block may include the first input buffer INRCV1, the first output buffer OUTDRV1, and the DQ pads (first and second signal pads SP1 and SP2) provided in a single unit. The DQIO block may be repeatedly provided in a single row pad structure. The power pads may be provided between each of the DQIO blocks.

The semiconductor device 210, which may be a bare semiconductor chip, may include circuits such as first through fourth input buffers INRCV1 through INRCV 4 and first through fourth output buffers OUTDRV1 through OUTDRV 4. The input buffers may: be referred to as input receivers and the output buffers may be referred to as output drivers.

The first through eighth signal pads SP1 through SP8 and the first through seventh power pads PP1 through PP7 may be respectively bonded to first ends of first through fifteenth connection lines CL1 through CL15, which form metal patterns. The second ends of the first through fifteenth connection lines CL1 through CL15 may be bonded to solder balls 231 of the PCB 230. Each of the first through fifteenth connection lines CL1 through CL15 may extend from the center of the semiconductor device 210 to an edge of the PCB 230.

Figure 3:
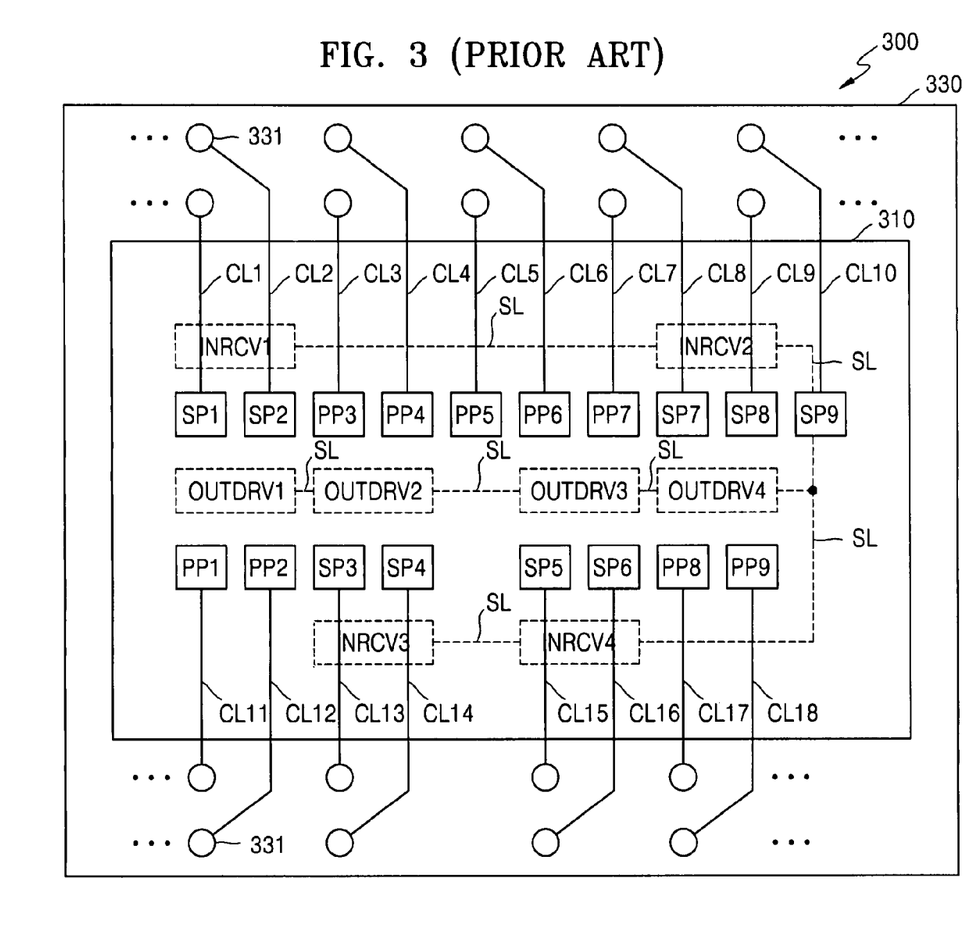
FIG. 3 is a plan view of a conventional semiconductor element including a semiconductor device having a two-row pad structure.

As the size of semiconductor devices continue to decrease, it may become increasingly difficult to arrange the signal and power pads in a single row pad structure. Thus, some conventional semiconductor devices include two-row pad structures as illustrated in FIG. 3. FIG. 3 is a plan view of a conventional semiconductor element including a semiconductor device having a two-row pad structure. As illustrated therein, a conventional semiconductor element 300 includes a semiconductor device 310 and a PCB 330.

A plurality of pads forming a two-row pad structure in the pad layer of the semiconductor device 310 are provided in a center pad arrangement. The pads include first through ninth signal pads SP1 through SP9 and first through ninth power pads PP1 through PP9. Control signals, such as input/output data signals and command signals, may be transmitted via the first through ninth signal pads SP1 through SP9. A power supply voltage, a ground voltage, or a termination voltage may be applied to the first through ninth power pads PP1 through PP9.

For example, the first and second signal pads SP1 and SP2 (DQ pads) may be provided between a first input buffer INRCV1 and a first output buffer OUTDRV1 and may be data input/output pads (DQIO). The first and second signal pads SP1 and SP2, the first input buffer INRCV1 and the first output buffer OUTDRV1 may form a DQIO block. The DQIO block may be repeatedly provided in the two-row pad structure of FIG. 3.

The DQ pads of the DQIO block may be provided in a first row of pads or in a second row of pads of a two-row pad structure. When the DQ pads are provided in the first row of pads, power pads may be provided the second row of pads. When the DQ pads are provided in the second row of pads, power pads may be provided in the first row of pads. Providing two-rows of pads as illustrated in FIG. 3 may allow the chip size of a semiconductor device to be decreased.

Figure 4:
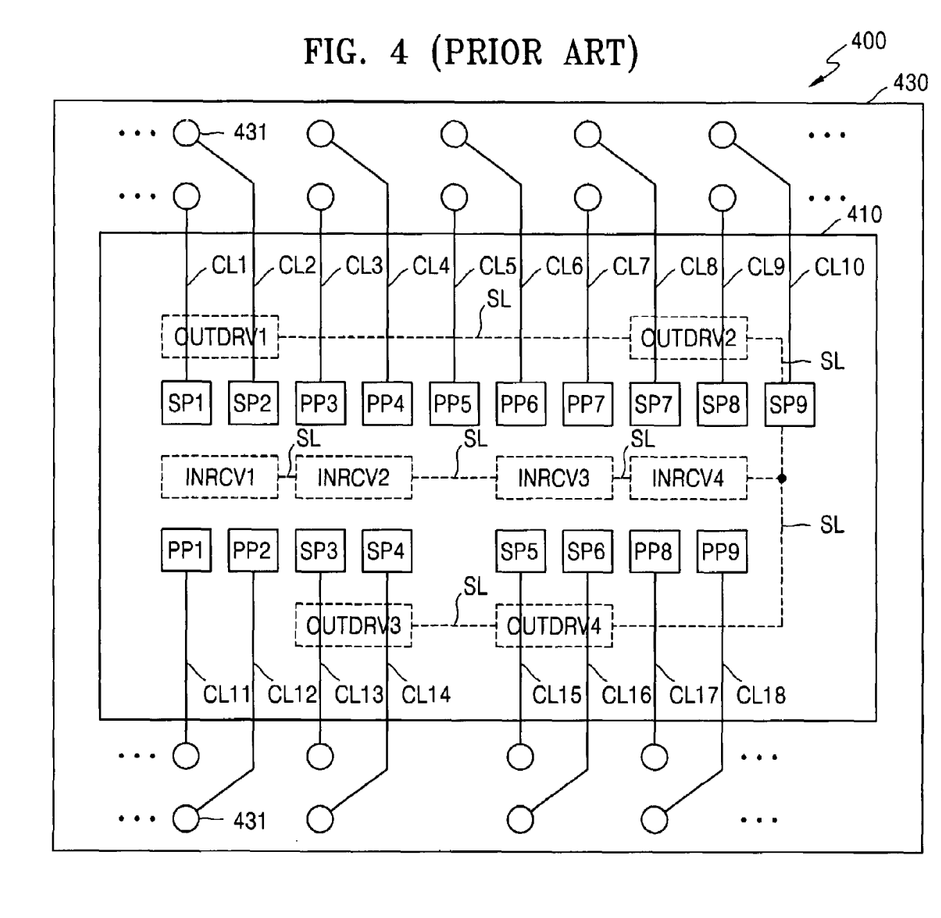
FIG. 4 is a plan view of a conventional semiconductor element including a semiconductor device having a two-row pad structure.

The semiconductor device 310 of FIG. 2, which may be a bare semiconductor chip, may include circuits such as first through fourth input buffers INRCV1 through INRCV 4 and first through fourth output buffers OUTDRV1 through OUTDRV4. A clock signal may be transmitted to the first through fourth input buffers INRCV1 through INRCV4 and the first through fourth output buffers OUTDRV1 through OUTDRV4 via a signal line SL. The clock signal may be a control signal input through the ninth signal pad SP9. As illustrated in FIG. 4, the first through fourth input buffers INRCV1 through INRCV4 may be located between a first row of pads and a second row of pads and the first through fourth output buffers OUTDRV1 through OUTDRV4 may be located between the edges of the semiconductor device 410 and a first row of pads and a second row of pads, respectively.

The first through ninth signal pads SP1 through SP9 and the first through ninth power pads PP1 through PP9 may be respectively bonded to first ends of the first through eighteenth connection lines CL1 through CL18, which form metal patterns. The second ends of the the first through eighteenth connection lines CL1 through CL18 may be respectively bonded to solder balls 331 of the PCB 330. Each of the first through eighteenth connection lines CL1 through CL18 may extend from one of the first through ninth single pads SP1 through SP9 and the first through ninth power pads PP1 through PP9 to an edge of the PCB 330. Thus, the semiconductor device 310 may be electrically coupled to an external device (not shown).

However, although the two-row pad structure of FIGS. 3 and 4 provides improvements over the single row pad structure, as the size of semiconductor devices continue to decrease, it may still be difficult to arrange all of the pads in a two-row pad structure. Furthermore, as the length of a signal line SL, which is configured to distribute a clock signal input through the ninth signal pad SP9, increases, the quality of a clock signal may be reduced due to resistive/capacitive (RC) delay.

SUMMARY OF THE INVENTION

Some embodiments of the present invention provide a semiconductor device including a printed circuit board and more than two-rows of power and/or signal pads disposed adjacent to one another on the printed circuit board.

In further embodiments of the present invention, a plurality of connection lines having first and second ends may be provided. The first ends may be electrically coupled to ones of the power and/or signal pads and the second ends may be electrically coupled to solder balls on an edge of the printed circuit board such that the plurality of connection lines do not intersect. Each of the more than two rows of power and/or signal pads may include power pads and/or signal pads and the more than two rows of power and/or signal pads may be provided in a center pad arrangement on the printed circuit board.

In still further embodiments of the present invention, the more than two rows may include three rows of power and/or signal pads. A first row of the three rows may include a first plurality of power pads, a second row of the three rows may include a plurality of signal and/or power pads and a third row of the three rows may include a second plurality of power pads. A plurality of output buffers may be provided between the first and second rows of the three rows and a plurality of input buffers may be provided between the second and third rows of the three rows. In certain embodiments of the present invention, a plurality of input buffers may be provided between the first and second rows of the three rows and a plurality of output buffers may be provided between the second and third rows of the three rows. A signal line that electrically couples the plurality of output buffers and the plurality of input buffers may be provided that has a reduced length.

Some embodiments of the present invention provide a semiconductor device including a printed circuit board and first, second and third rows of power and/or signal pads on the printed circuit board. A plurality of input and output buffers are also provided. Ones of the plurality of input and output buffers are provided between the first and second rows and others of the plurality of input and output buffers are provided between the second and third rows.

In further embodiments of the present invention, a plurality of connection lines may have first and second ends. The first ends may be electrically coupled to ones of the power and/or signal pads in the first, second and third rows and the second ends may be electrically coupled to solder balls on an edge of the printed circuit board such that the plurality of connection lines do not intersect. The first row may include a first plurality of power pads, the second row may include a plurality of power and/or signal pads and the third row may include a second plurality of power pads. A signal line that electrically couples the plurality of output buffers and the plurality of input buffers may be provided that has a reduced length.

While the present invention is described above primarily with reference semiconductor devices, methods of fabricating semiconductor devices memory cells are also provided herein.

DETAILED DESCRIPTION OF EMBODIMENTS OF THE PRESENT INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
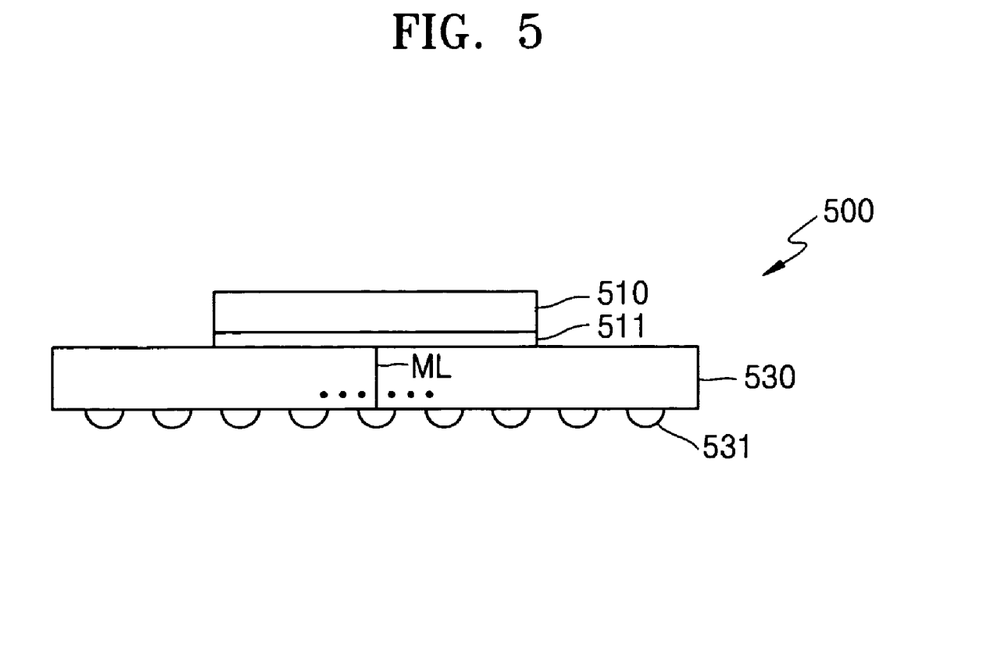
FIG. 5 is a cross section illustrating a semiconductor element including a semiconductor device including a pad structure according to some embodiments of the present invention.

Referring now to FIG. 5, a cross section of a semiconductor element including a semiconductor device having more than two-row pad structures will be discussed. As illustrated in FIG. 5, the semiconductor element 500 includes the semiconductor device 510 and a printed circuit board (PCB) 530, for example, having a ball grid array (BGA) package type. The semiconductor device 510 may be a bare semiconductor chip, for example a DRAM, and includes a pad layer 511 on a surface adjacent the PCB 530. A row pad, which is included in the pad layer 511, is electrically coupled to a plurality of solder balls 531 on a surface of the PCB 530 opposite the pad layer 511 via a corresponding metal line ML. The solder balls 531 may also be electrically coupled to an external device (not shown).

Figure 6:
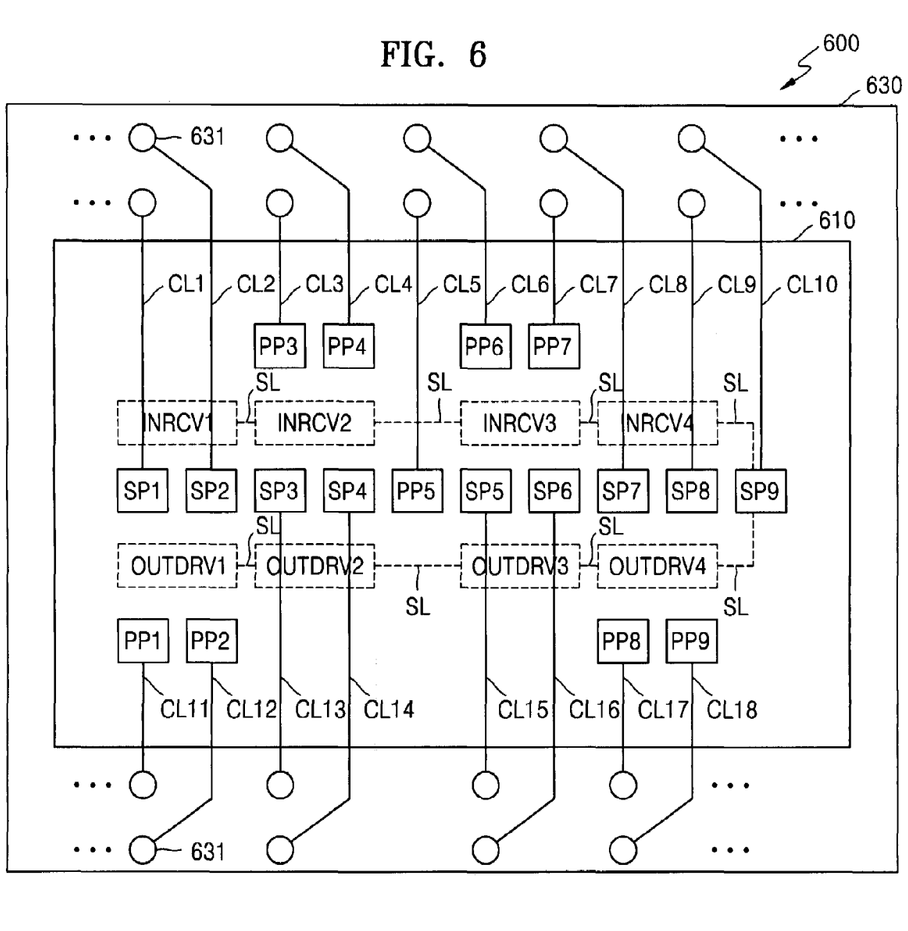
FIG. 6 is a plan view of a semiconductor element including a semiconductor device having a three-row pad structure according to some embodiments of the present invention.

Referring now to FIG. 6, a plan view of a semiconductor element including a semiconductor device having a three-row pad structure according to some embodiments of the present invention will be discussed. Furthermore, FIG. 6 illustrates a detailed version of the pad layer 511 illustrated in FIG. 5. As illustrated in FIG. 6, a semiconductor element 600 according to the some embodiments of the present invention include a semiconductor device 610 and a printed circuit board (PCB) 630.

A plurality of pads having a three-row pad structure in the pad layer 511 of the semiconductor device 610 are provided in a center pad arrangement. As illustrated, the pads include first through ninth signal pads SP1 through SP9 and first through ninth power pads PP1 through PP9. Control signals, such as input/output data signals and command signals, are transmitted via the first through ninth signal pads SP1 through SP9. A power supply voltage (VDD), a ground voltage (VSS), or a termination voltage may be applied to the first through ninth power pads PP1 through PP9.

For example, the first and second signal pads SP1 and SP2 may be provided between a first input buffer INRCV1 and a first output buffer OUTDRV1, thus, the first and second signal pads SP1 and SP2 may be data input/output pads (DQIO pads). Accordingly, the first input buffer INRCV1, the first output buffer OUTDRV1 and the DQIO pads provides a DQIO block. In embodiments of the present invention illustrated in FIG. 6, the DQIO pads of the DQIO block may be provided in a second row of pads of the three-row pad structure. The first through ninth power pads PP1 through PP9 may be respectively provided in a first row of pads, the second row of pads and a third row of pads of the three-row pad structure as illustrated in FIG. 6.

The semiconductor device 610, which may be a bare semiconductor chip, may include circuits, such as first through fourth input buffers INRCV1 through INRCV4 and first through fourth output buffers OUTDRV1 through OUTDRV4. The first through fourth input buffers INRCV1 through INRCV4 may be provided between the the third, fourth, sixth and seventh power pads PP3, PP4, PP6 and PP7, which may provide the first row of pads of the three-row pad structure, and the first through ninth signal pads SP1 through SP9 and the fifth power pad, which form the second row of pads of the three-row pad structure. The first through fourth output buffers OUTDRV1 through OUTDRV4 may be provided between the first through ninth signal pads SP1 through SP9 and the fifth power pad, which form the second row of pads of the three-row pad structure, and the first, second, eighth and ninth power pads PP1, PP2, PP8, and PP9, which form the third row of pads.

A clock signal may be transmitted to the first through fourth input buffers INRCV1 through INRCV4 and the first through fourth output buffers OUTDRV1 through OUTDRV4 via a signal line SL. The clock signal may be a control signal input via the ninth signal pad SP9. The length of the signal line SL, which distributes the clock signal, has a reduced length because the first through fourth input buffers INRCV1 through INRCV4 and the first through fourth output buffers OUTDRV1 through OUTDRV4 are provided in respective lines adjacent to the second row of pads of the three-row pad structure, thus, possibly providing an improved clock signal for the semiconductor device 610. Accordingly, the semiconductor device 610 may have reduced power dissipation and perform high-frequency operations.

The first through ninth signal pads SP1 through SP9 and the first through ninth power pads PP1 through PP9 may be respectively bonded to first ends of first through eighteenth connection lines CL1 through CL18, which form metal patterns. The second ends of the first through eighteenth connection lines CL1 through CL18 are respectively bonded to solder balls 631 of the PCB 630. Each of the first through eighteenth connection lines CL1 through CL18 extends from one of the first through ninth signal pads SP1 through SP9 and one of the first through ninth power pads PP1 through PP9 to an edge of the PCB 630.

Although the first and third rows of pads of the semiconductor device 610 according to some embodiments of the present invention illustrated in FIG. 6 include only power pads, embodiments of the present invention are not limited to this configuration. For example, a first or third row of pads of the semiconductor device may include a signal pad or a power pad without departing from the scope of the present invention. Furthermore, although the semiconductor device 610 discussed with respect to FIG. 6 includes a three-row pad structure, embodiments of the present invention are not limited to this configuration. For example, embodiments of the present invention may include four or more rows without departing from the scope of the present invention. Embodiments of the present invention having four or more rows may include more pads without increasing the overall size of the chip.

Figure 7:
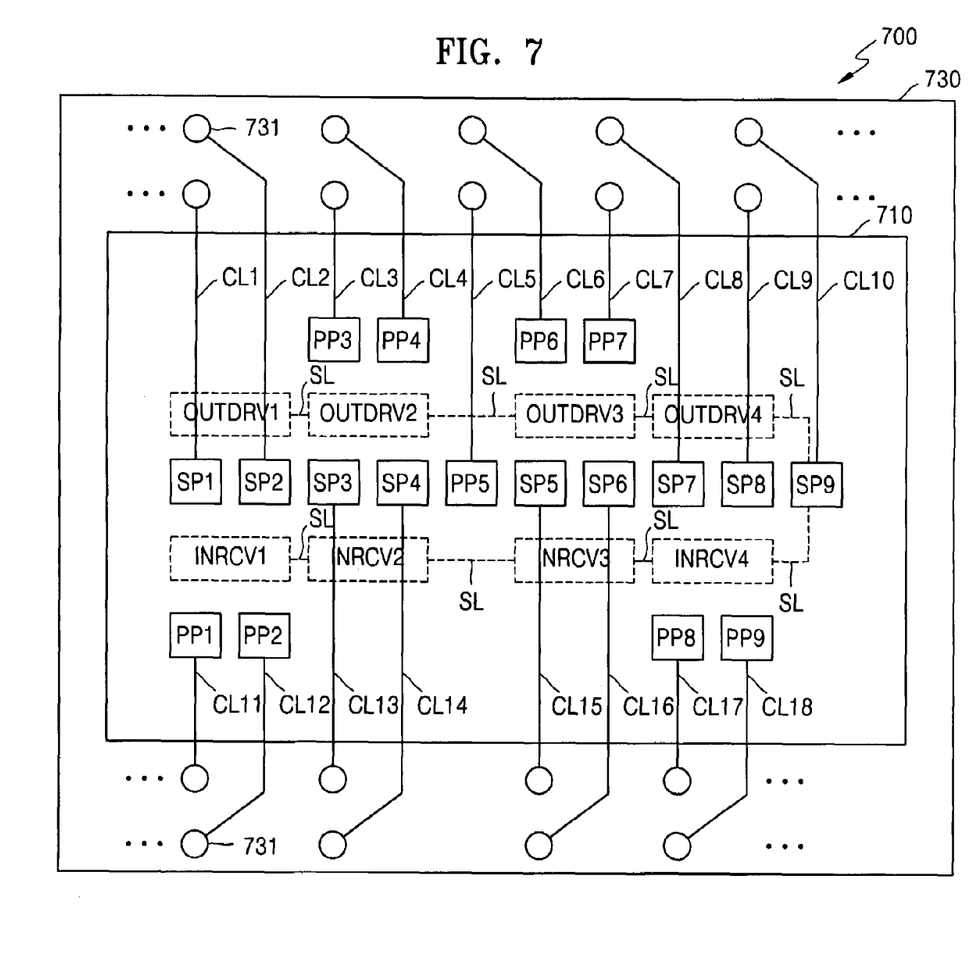
FIG. 7 is a plan view of a semiconductor element including a semiconductor device having a three-row pad structure according to further embodiments of the present invention.

Referring now to FIG. 7, a plan view of a semiconductor element including a semiconductor device having a three-row pad structure according to further embodiments of the present invention will now be discussed. Like elements of FIG. 7 are similar to those discussed with respect to FIG. 6 and, therefore, will not be discussed in detail herein. As illustrated in FIG. 7, the positions of the first through fourth input buffers INRCV1 through INRCV4 and the first through fourth output buffers OUTDRV1 though OUTDRV4 are exchanged in FIG. 7. In particular, the first through fourth output buffers OUTDRV1 through OUTDRV4 may be provided between the third, fourth, sixth and seventh power pads P3, P4, P6 and P7, which may provide the first row of pads of the three-row pad structure, and the first through ninth signal pads SP1 through SP9 and the fifth power pad P5, which form the second row of pads of the three-row pad structure. The first through fourth input buffers INRCV1 through INRCV4 are provided between the first through ninth signal pads SP1 through SP9 and the fifth power pad P5, which form the second row of pads of the three-row pad structure, and the first, second, eighth and ninth power pads PP1, PP2, PP8, and PP9, which form the third row of pads.

The semiconductor devices discussed herein with respect to FIGS. 5 through 7 may be fabricated using methods and processes known to those having skill in the art. Accordingly, details with respect to the methods will not be discussed in detail herein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor device comprising:
   a printed circuit board;
   more than two-rows of power and/or signal pads disposed adjacent to one another on the printed circuit board, wherein the more than two rows comprises three rows of power and/or signal pads, wherein a first row of the three rows comprises a first plurality of power pads, wherein a second row of the three rows comprises a plurality of signal and power pads and wherein a third row of the three rows comprises a second plurality of power pads;
   a plurality of output buffers between the first and second rows of the three rows; and
   a plurality of input buffers between the second and third rows of the three rows.

2. The device of claim 1, further comprising:
   a plurality of connection lines having first and second ends, the first ends being electrically coupled to ones of the power and/or signal pads and the second ends being electrically coupled to solder balls on an edge of the printed circuit board such that the plurality of connection lines do not intersect.

3. The device of claim 1, further comprising a signal line that electrically couples the plurality of output buffers and the plurality of input buffers, the signal line having a reduced length.

4. A semiconductor device comprising:
   a printed circuit board;
   more than two-rows of power and/or signal pads disposed adjacent to one another on the printed circuit board, wherein the more than two rows comprises three rows of power and/or signal pads, wherein a first row of the three rows comprises a first plurality of power pads, wherein a second row of the three rows comprises a plurality of signal and power pads and wherein a third row of the three rows comprises a second plurality of power pads;
   a plurality of input buffers between the first and second rows of the three rows; and
   a plurality of output buffers between the second and third rows of the three rows.

5. The device of claim 4, further comprising a signal line that electrically couples the plurality of output buffers and the plurality of input buffers, the signal line having a reduced length.

6. A semiconductor device comprising:
   a printed circuit board;
   first, second and third rows of power and/or signal pads on the printed circuit board; and
   a plurality of input and output buffers, ones of the plurality of input and output buffers being provided between the first and second rows and others of the plurality of input and output buffers being provided between the second and third rows,
   wherein the first row comprises a first plurality of power pads, wherein the second row comprises a plurality of power and signal pads and wherein the third row comprises a second plurality of power pads.

7. The device of claim 6, further comprising a plurality of connection lines having first and second ends, the first ends being electrically coupled to ones of the power and/or signal pads in the first, second and third rows and the second ends being electrically coupled to solder balls on an edge of the printed circuit board such that the plurality of connection lines do not intersect.

8. The device of claim 6, further comprising a signal line that electrically couples the plurality of output buffers and the plurality of input buffers, the signal line having a reduced length.

9. A method of fabricating a semiconductor device comprising:
   forming more than two-rows of power and/or signal pads disposed adjacent to one another on a printed circuit board, wherein forming the more than two rows comprises forming three rows of power and/or signal pads, wherein a first row of the three rows comprises a first plurality of power pads, wherein a second row of the three rows comprises a plurality of signal and power pads and wherein a third row of the three rows comprises a second plurality of power pads;

forming a plurality of output buffers between the first and second rows of the three rows; and forming a plurality of input buffers between the second and third rows of the three rows.

10. The method of claim 9, further comprising:

forming a plurality of connection lines having first and second ends, the first ends being electrically coupled to ones of the power and/or signal pads and the second ends being electrically coupled to solder balls on an edge of the printed circuit board such that the plurality of connection lines do not intersect.

11. The method of claim 9, further comprising a signal line that electrically couples the plurality of output buffers and the plurality of input buffers, the signal line having a reduced length.

12. A method of fabricating a semiconductor device comprising:

forming more than two-rows of power and/or signal pads disposed adjacent to one another on a printed circuit board, wherein forming the more than two rows comprises forming three rows of power and/or signal pads, wherein a first row of the three rows comprises a first plurality of power pads, wherein a second row of the three rows comprises a plurality of signal and power pads and wherein a third row of the three rows comprises a second plurality of power pads;

forming a plurality of input buffers between the first and second rows of the three rows; and forming a plurality of output buffers between the second and third rows of the three rows.

13. The method of claim 12, further comprising forming a signal line that electrically couples the plurality of output buffers and the plurality of input buffers, the signal line having a reduced length.

14. A method of forming a semiconductor device comprising:

forming first, second and third rows of power and/or signal pads on a printed circuit board; and forming a plurality of input and output buffers, ones of the plurality of input and output buffers being provided between the first and second rows and others of the plurality of input and output buffers being provided between the second and third rows, wherein the first row comprises a first plurality of power pads, wherein the second row comprises a plurality of power and signal pads and wherein the third row comprises a second plurality of power pads.

15. The method of claim 14, further comprising forming a plurality of connection lines having first and second ends, the first ends being electrically coupled to ones of the power and/or signal pads in the first, second and third rows and the second ends being electrically coupled to solder balls on an edge of the printed circuit board such that the plurality of connection lines do not intersect.

16. The method of claim 14, further comprising a signal line that electrically couples the plurality of output buffers and the plurality of input buffers, the signal line having a reduced length.

* * * * *